United States Patent [19]

Szudarek et al.

[11] Patent Number: 5,608,611

[45] Date of Patent: Mar. 4, 1997

[54] VEHICLE ELECTRONIC MODULE WITH INTEGRAL MOUNTING AND GROUNDING MEANS

[75] Inventors: Robert G. Szudarek, Warren; Yew T. Yeow, Southfield; Arnold D. Nielsen, Northville; Roger Cook, Livonia, all of Mich.

[73] Assignee: United Technologies Automotive, Inc./Ford Motor Company, Dearborn, Mich.

[21] Appl. No.: 538,807

[22] Filed: Oct. 3, 1995

[51] Int. Cl.$^6$ .............................. H05K 5/04; H05K 5/02; H01R 4/66

[52] U.S. Cl. .................. 361/753; 174/51; 174/138 G; 174/35 R; 361/742; 361/758; 361/818; 439/101; 439/108; 439/947

[58] Field of Search ........................ 174/51, 138 E, 174/138 G, 35 R, 35 GC; 439/92, 95, 97, 947, 101, 108, 607; 361/733, 736, 753, 758, 742, 807, 808, 816, 818, 826

[56] References Cited

U.S. PATENT DOCUMENTS

| | | |
|---|---|---|
| 4,650,274 | 3/1987 | Schmid ............................ 439/97 |
| 4,875,140 | 10/1989 | Delpech et al. ............... 174/138 G |
| 5,023,752 | 6/1991 | Detter et al. ...................... 361/752 |
| 5,026,292 | 6/1991 | Pickles et al. ..................... 439/108 |
| 5,079,671 | 1/1992 | Garrett et al. .................... 439/108 |
| 5,160,807 | 11/1992 | Fry et al. ........................ 174/35 R |
| 5,352,850 | 10/1994 | Norris ................................. 174/51 |
| 5,417,578 | 5/1995 | Mroczkowski et al. ........... 439/101 |
| 5,442,133 | 8/1995 | Arnold et al. ...................... 439/92 |

*Primary Examiner*—Donald Sparks
*Assistant Examiner*—John B. Vigushin
*Attorney, Agent, or Firm*—Banner & Witcoff, Ltd.

[57] ABSTRACT

An electronic module includes a Printed Circuit Board (PCB) which contains a plurality of circuit elements. The electronic module is electrically connected to other electrical components in a vehicle by a connector. The PCB is contained within an electrically conductive housing which includes a box and a cover. A ground trace printed on the PCB extends to a mounting hole in the PCB and provides a ground path for the circuit elements. An electrically conductive metal ferrule which elevates the PCB above the box and the cover above the PCB, extends through the mounting hole in the PCB and contacts the cover and box when the cover is fitted onto the box. A mounting bolt extends through the cover inside the ferrule through the box and into a nut mounted into a metal portion of the vehicle.

5 Claims, 3 Drawing Sheets

VEHICLE ELECTRONIC MODULE WITH INTEGRAL MOUNTING AND GROUNDING MEANS

FIELD OF THE INVENTION

This invention relates to the field of vehicle electrical systems and more particularly to reliably grounding electrical components in a vehicle.

BACKGROUND OF THE INVENTION

Vehicle electrical systems require electrical paths common to the electrical components in the vehicle to provide a ground path for those components. Providing an effective ground path is particularly important in protecting the low energy electronic components which are finding increasing use in vehicles. A typical mechanism for grounding an electronic module is seen in U.S. Pat. No. 5,023,752 at FIG. 2 which shows a cable which is electrically connected to an electronic module at a first end and to ground, via a battery terminal at a second end. While such a mechanism provides an effective ground, the grounding cable introduces both cost and manufacturing complexity to the vehicle. In addition, the cable provides an added point of failure, particularly in the connections at the ends of the cable.

Accordingly, it is an object of the present invention to provide a mechanism which provides a reliable ground path electrical components within a vehicle in cost-effective manner.

It is a further object of the invention to simplify manufacturing of a vehicle by providing an electronic module which reduces the number of steps required in mounting the module to the vehicle.

SUMMARY OF THE INVENTION

In a primary aspect of the invention, an apparatus for grounding an electronic module in a vehicle comprises a circuit board which includes a plurality of circuit elements mounted thereon and a plurality of electrically conductive traces printed thereon. The electrically conductive traces include a ground trace which extends to an opening in the circuit board and which provides an electrical path to ground for the circuit elements. A housing which encloses the circuit board comprises an electrically conductive box positioned beneath the circuit board and an electrically conductive cover which seals the box. The cover and the box each have a mounting hole formed therein. An electrically conductive spacer is disposed within the opening in the circuit board. The spacer contacts the cover at a first end and the box at a second end. A nut is mounted to a metal portion of the vehicle. A bolt extends through a mounting hole in the cover, through the spacer and a mounting hole in the box and is threaded in the nut, to provide an electrical connection from the ground trace to the metal portion.

An advantage of certain preferred embodiments, is that a reliable ground path for the circuit elements on the circuit boar, is provided in a cost effective manner. Securing the circuit board and the housing with the mounting bolt provides a ground path from the circuit elements through the ground trace, the spacer, the cover, the bolt, and the nut, to the metal portion. Use of the bolt to both mount the housing and the circuit board and to provide a ground path increases reliability and reduces cost.

In additional aspects of the invention, the nut takes the form of a self-threading nut which may be welded to the metal portion of the vehicle before painting of the vehicle body. This advantageously reduces manufacturing cost and complexity by allowing the nut to be painted along with the body, with the bolt establishing an electrical connection with the body upon installation of the housing. In a further aspect of the invention a ground trace extends to a connector hole in the circuit board. This feature advantageously provides a ground path for electronic components electrically coupled to the circuit board by the connector.

These and other features and advantages of the present invention may be better understood by considering the following detailed description of certain preferred embodiments of the invention. In the course of this description, reference will be made to the attached drawings.

DETAILED DESCRIPTION

Figure 1:
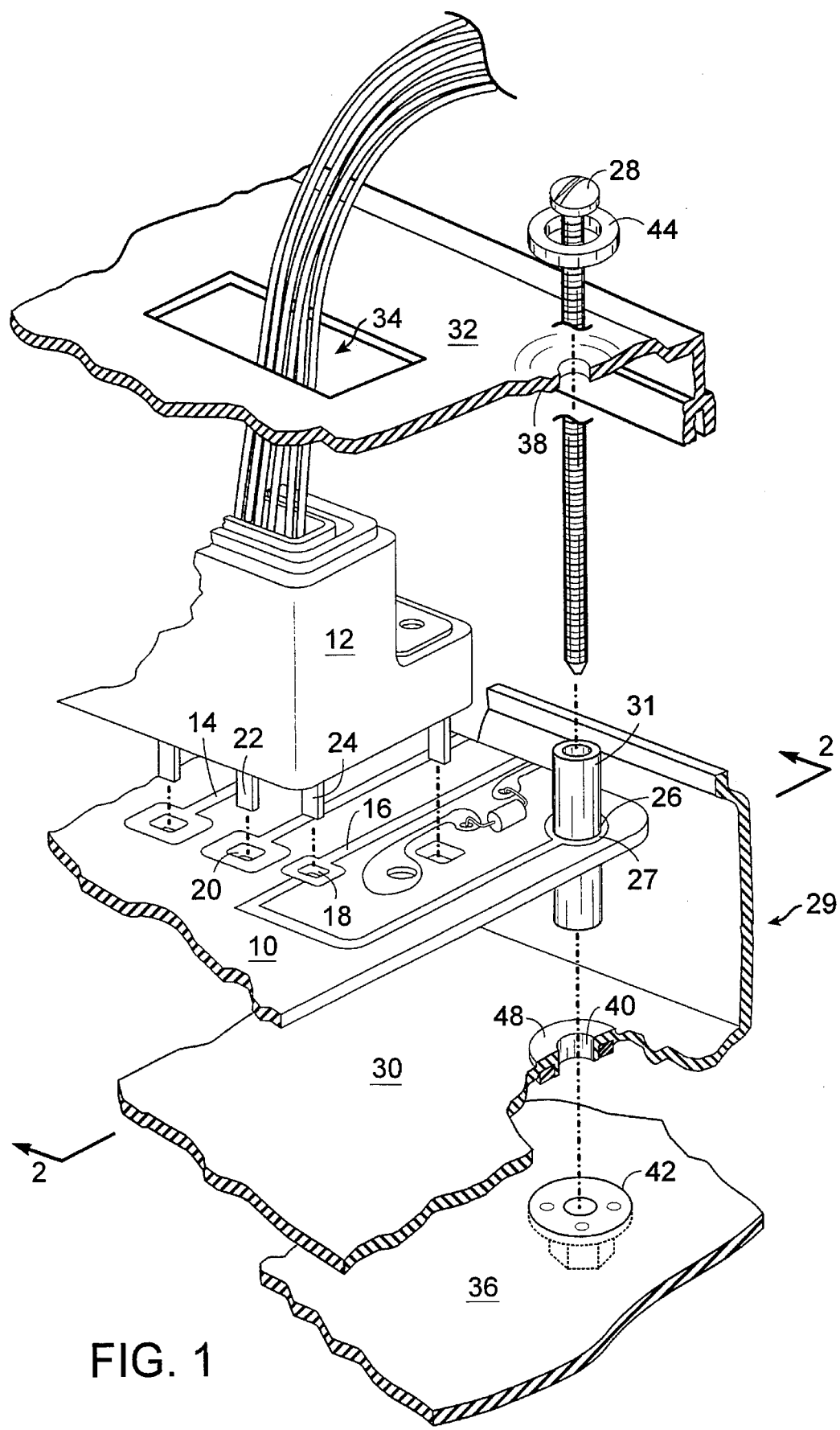
FIG. 1 is an exploded view of a preferred embodiment.
Figure 3:
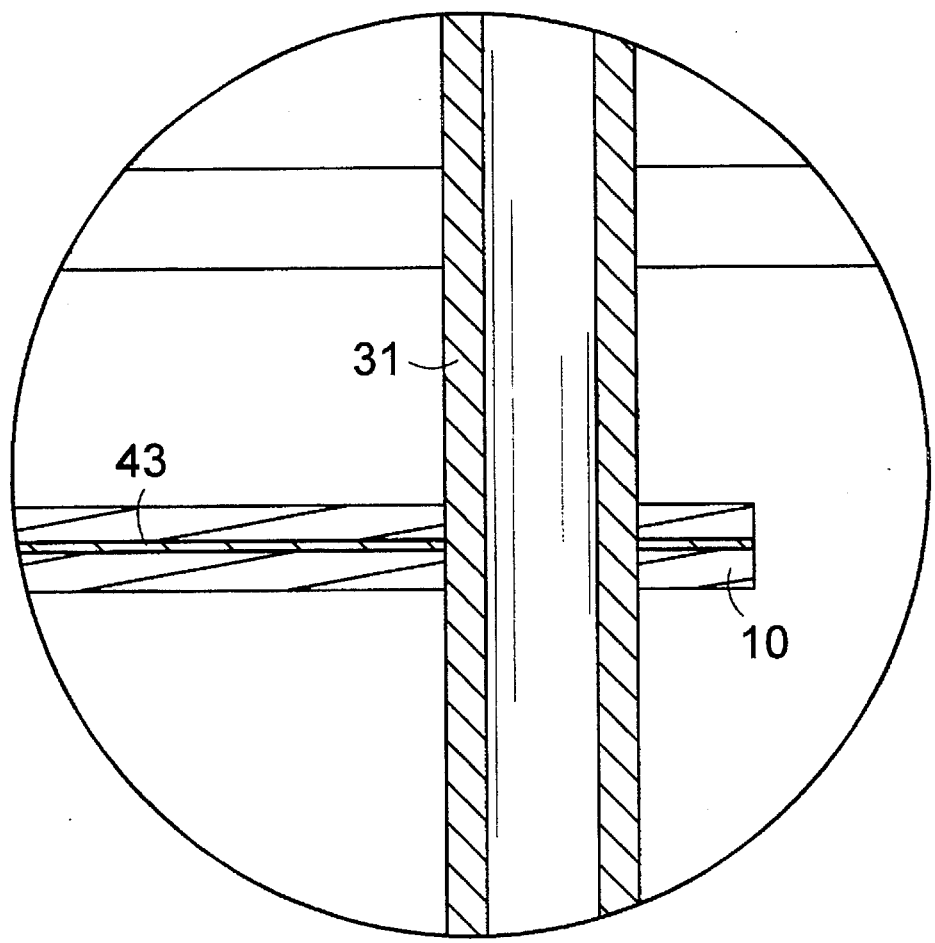
FIG. 3 is an expanded view of the portion of FIG. 2 labeled by reference number 3.

FIG. 1 of the drawings shows a preferred device for providing a ground path for an electronic module in a vehicle. In FIG. 1, a Printed Circuit Board (PCB) 10 is electrically connected to other electrical components by a connector module 12. PCB 10 takes the form of a multilayer glass epoxy circuit board with electrically conductive paths such as seen at 14 and 16 printed thereon. The electrically conductive paths electrically connect circuit elements mounted upon the PCB and circuit elements formed within the PCB. The PCB has formed therein a plurality of connector holes such as seen at 18 and 20 which respectively accept pins such as seen at 24 and 22 of connector module 12. Each of pins 22 and 24 form an electrical connection with one or more electrically conductive paths formed upon the surface of the PCB or in an inner layer of the PCB. At least one of the pins on the connector module 12 serves the purpose of providing an electrical path to ground for the electrical components connected to the connector module 12. Such a pin, termed herein as a ground pin, is seen in FIG. 1 at 24. Thus, the grounding apparatus described herein may be used to ground circuitry on PCB 10 as well as circuitry connected to PCB 10 by connector 12. As seen in FIG. 1, ground pin 24 is electrically connected to electrically conductive path 16, termed herein as a ground trace. Ground trace 16 extends from connector hole 18, which receives ground pin 24, to mounting hole 26, which receives mounting bolt 28. PCB 10 may contain a number of ground traces which are electrically connected to ferrule 31, in order to ground other pins of connector 12. In addition, other traces may be printed on or within PCB 10 to connect selected pins of module 12. A cylindrically shaped, metal ferrule 31 which is soldered to PCB 10 performs two functions. First, the ferrule 31 acts as a spacer which elevates PCB 10 above box 30, and which elevates cover 32 above PCB 10, thus advantageously promoting dissipation of heat on PCB 10. Second, ferrule 31 provides an electrical ground path from ground trace 16 to bolt 28. Alternatively, ferrule 31 may be press fitted into mounting hole 26 or mechanically attached in some other way which provides an electrical path between ground trace 16 and ferrule 31. Rather than utilizing a ground trace 16 which is printed upon the surface of PCB 10, a ground plane within PCB 10 as shown at 43 in FIG. 3, may be used. In such an embodiment, the ferrule 31 contacts the ground plane as it extends through mounting hole 26.

PCB 10 is mounted within a housing 29 which takes the form of a box 30 and cover 32. Preferably box 30 and cover 32 are formed of an electrically conductive material and enclose PCB 10 to protect PCB 10 from contaminants. Cover 32 has formed therein an opening 34 which is shaped to receive connector module 12. Connector module 12 preferably has a sealing gasket mounted around the periphery of the module to form a seal with cover 32 when the connector pins are fitted into the corresponding holes on the PCB 10.

Mounting bolt 28 advantageously performs the functions of: (1) mounting PCB 10 within the housing 29, (2) mounting the housing 29 to a metal portion 36 of the vehicle, and (3) electrically connecting ground trace 16 to metal portion 36. Metal portion 36 is preferably a portion of the vehicle frame/body. Mounting bolt 28, is preferably formed of steel. However, alternative materials, or composites which are rigid and electrically conductive may also be used. Mounting bolt 28 extends through a mounting hole 38 in cover 32, through mounting hole 26 in PCB 10, through mounting hole 40 in box 30 and into nut 42. Nut 42 is formed of steel and is welded to metal portion 36 prior to painting of the vehicle body. Nut 42 is advantageously self-threading, thus allowing a positive electrical connection from bolt 28 to the metal portion 36 even after the painting of the vehicle body during the vehicle assembly process. Alternatively fasteners such as threaded screws or bolts may also be used. A first sealing washer 44 positioned on the exterior surface of cover 32 and a second sealing washer positioned in interior surface 48 of box 30 each seal the housing. Washers 44 and 48 are each formed of electrically conductive material.

As seen in FIG. 1, ground trace 16 is printed to establish an electrical connection with ferrule 31 via weld joint 27 which welds ferrule 31 to mounting hole 26. Cover 32 fits upon ferrule 31 and provides an electrical connection between ferrule 31 and bolt 28, via washer 44. Bolt 28, which is self-threading, establishes a positive, robust electrical connection with weld nut 42 upon tightening of the bolt. The weld nut 42 which is welded to metal position 36 completes the electrical connection from the ground path 16 to the electrical connection from the ground path 16 to the metal position 36. The device shown in FIG. 1 may be used in any of a number of different locations in a vehicle to provide an electrical connection to ground for an electronic module.

Figure 2:
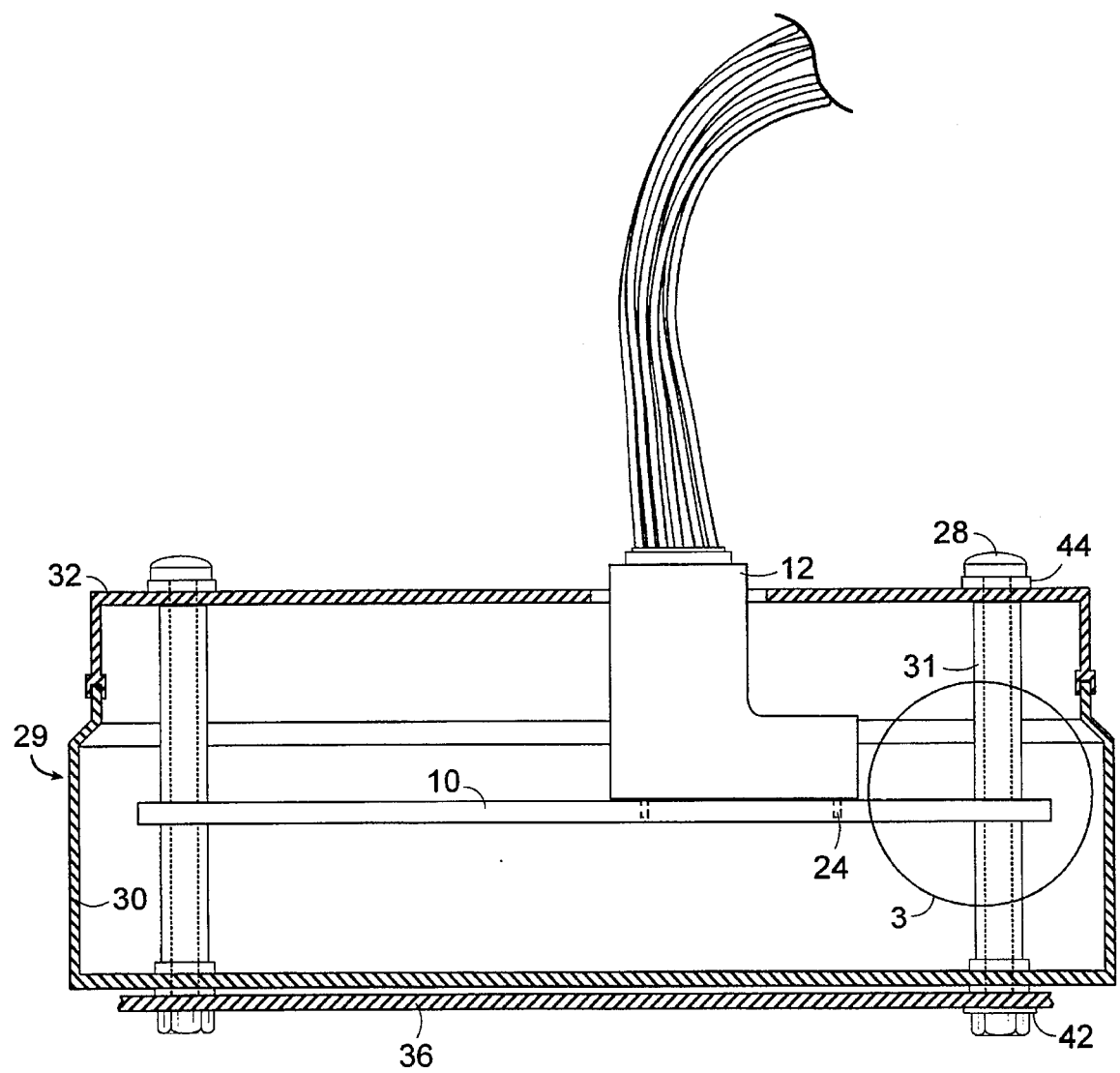
FIG. 2 is a cross-sectional view of a portion of FIG. 1.

FIG. 2 of the drawings shows a cross-sectional view of the housing 28 with the cover 32 in a closed position. As can be seen in FIG. 2, cover 32 is fitted tightly onto box 30. Bolt 28 as seen screwed into nut 42, fits tightly onto cover 32. Ferrule 31 contacts cover 32 and box 30. As can be seen, use of bolt 28 to mount PCB 10 and housing 29 to the metal portion 36 of the vehicle forms an electrical path from ground trace 16 to ferrule 31, to cover 32, to bolt 28 to nut 42 to metal position 36.

The specific mechanisms and techniques which have been described are merely illustrative of one application of the principles of the invention. For instance, the specific physical configuration of the elements, shown in the drawings are merely illustrative of a preferred embodiment. Variations of such configurations as well as additional modifications may be made to the methods and apparatus described without departing from the true spirit and scope of the invention.

What is claimed is:

1. Apparatus for grounding an electronic module in a vehicle comprising:

a circuit board comprising, a plurality of circuit elements mounted thereon;

a plurality of electrically conductive traces printed thereon including a ground trace for providing an electrical path to ground for said circuit elements, said ground trace extending to an opening in said circuit board;

a housing, for enclosing said circuit board, comprising an electrically conductive box positioned beneath said circuit board and an electrically conductive cover for sealing said box, said cover and said box each having a mounting hole formed therein;

an electrically conductive spacer disposed within said opening in said circuit board and contacting said cover at a first end and said box at a second end;

a nut mounted to a metal portion of said vehicle; and a bolt extending through said mounting hole in said cover, through said spacer, and said mounting hole in said box, and being threaded in said nut, to provide an electrical connection from said ground trace to said metal portion.

2. Apparatus as set forth in claim 1 wherein the nut is a self-threading nut.

3. Apparatus as set forth in claim 2 wherein said circuit board further comprises a plurality of connector holes formed therein, one of said connector holes being electrically coupled to said ground trace, and wherein the apparatus further comprises a connector for electrically coupling said circuit board to electronic circuitry physically separated from said circuit board, said connector having a plurality of pins, each of said pins fitting into a corresponding one of said connector holes.

4. Grounding apparatus for electrically grounding an electronic module in a motor vehicle comprising:

a circuit board comprising a mounting hole and a plurality of electronic circuit elements and a plurality of circuit traces printed onto said circuit board, one of said circuit traces being a ground trace which provides a ground path electrically connected to an opening in said circuit board;

a connector electrically connected by a plurality of pins to said circuit board, one of said pins being a ground pin which is electrically connected to said ground trace;

a nut mounted in a metal portion of said vehicle;

electrically conductive housing means for enclosing said circuit board; electrically conductive spacer means extending through said mounting hole and contacting said housing means; and a bolt extending through and contacting said housing means and extending through said mounting hole and being fitted into said nut.

5. Apparatus for grounding an electronic module in a vehicle comprising:

a circuit board comprising, a plurality of circuit elements mounted thereon;

a plurality of electrically conductive traces printed thereon;

a ground plane for providing an electrical path to ground for said circuit elements, said ground plane comprising a layer in said circuit board and extending to an opening in said circuit board;

a housing, for enclosing said circuit board, comprising an electrically conductive box positioned beneath said circuit board and an electrically conductive cover for sealing said box, said cover and said box each having a mounting hole formed therein;

an electrically conductive spacer disposed within said opening in said circuit board and contacting said cover at a first end and said box at a second end;

a nut mounted to a metal portion of said vehicle; and a bolt extending through said mounting hole in said cover, through said spacer, and said mounting hole in said box, and being threaded in said nut, to provide an electrical connection from said ground plane to said metal portion.

* * * * *